United States Patent
Allada et al.

(10) Patent No.: US 6,218,317 B1
(45) Date of Patent: Apr. 17, 2001

(54) METHYLATED OXIDE-TYPE DIELECTRIC AS A REPLACEMENT FOR $SIO_2$ HARDMASKS USED IN POLYMERIC LOW K, DUAL DAMASCENE INTERCONNECT INTEGRATION

(75) Inventors: Sudhakar Allada, San Jose, CA (US); Chris Foster, Austin, TX (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/294,914

(22) Filed: Apr. 19, 1999

(51) Int. Cl.[7] ..................................... H01L 21/31
(52) U.S. Cl. .................. 438/780; 438/762; 438/774; 438/775; 438/787; 438/789
(58) Field of Search ..................... 458/687, 678, 458/751, 752, 762, 774, 775, 780, 787, 789; 438/623; 430/313

(56) References Cited

U.S. PATENT DOCUMENTS

| | | | |
|---|---|---|---|
| 5,924,005 | 7/1999 | Wado | 438/623 |
| 6,028,015 | * 3/1999 | Wang et al. | 438/789 |
| 6,100,195 | * 12/1998 | Chan et al. | 438/687 |
| 6,136,511 | 10/2000 | Reinberg et al. | 430/313 |

OTHER PUBLICATIONS

"Integaration of Organic Loe–k Material with Cu–Damascene Employing Novel Process" Masonobu Ikeda, et al., 1998 IEEE, IITC 98–131.

* cited by examiner

*Primary Examiner*—David Nelms
*Assistant Examiner*—Reneé Berry
(74) *Attorney, Agent, or Firm*—Stallman & Pollock LLP

(57) ABSTRACT

Disclosed are multilevel interconnects for integrated circuit devices, especially copper/dual damascene devices, and methods of fabrication. Methylated-oxide type hardmasks are formed over polymeric interlayer dielectric materials. Preferably the hardmasks are materials having a dielectric constant of less than 3 and more preferably 2.7 or less. Advantageously, both the hardmask and the interlayer dielectric can be spincoated.

18 Claims, 1 Drawing Sheet

METHYLATED OXIDE-TYPE DIELECTRIC AS A REPLACEMENT FOR SIO₂ HARDMASKS USED IN POLYMERIC LOW K, DUAL DAMASCENE INTERCONNECT INTEGRATION

BACKGROUND OF THE INVENTION

1. Field of the Invention

The present invention relates to interconnect integration technology. More specifically, the present invention relates to methylated oxide-type hardmasks for patterning interlayer dielectrics in integrated circuit device fabrication.

2. Description of the Related Art

Integration of multilevel interconnects becomes increasingly important with ever increasing demands for device miniaturization and speed. In fact, with sub-0.25 μm geometries, interconnect capacitance is much larger than transistor capacitance. A reduction of the interconnect capacitance decreases RC and in turn, delay, thereby increasing device speed.

Efforts to improve device performance include reducing the dielectric constant of interlayer dielectrics and the electrical resistance of interconnects, thereby reducing the wiring delay. Ikeda, et al., *I.E.E.E. Inter. Interconnect Technology Conf.* (1998) p. 131, describe a low k polymeric dielectric with a Cu-damtascene structure. The polymeric dielectric (AlClied Signal's FLARE™) was spin coated on undoped silicon glass (USG). The polymeric dielectric was then patterned through an overlying USG hardmask. Copper lines were formed by sputtering and CMP. Ikeda, et al. reported advantageous use of USG in achieving simultaneous resist ashing and etching of the polymeric dielectric as well as anisotropic $O_2$ RIE etching. In addition, Ikeda, et al. reported relatively decreased wiring resistance of copper metallization formed in the polymeric dielectric with increasing metallization width.

However, certain disadvantages attend. As those of skill in the art will appreciate, conventional processing to put a USG hardmask on a polymeric dielectric requires removal of the wafer from spin track equipment after formation of a polymeric dielectric to a different machine in order to create the hardmask. In addition, conventional USG hardmasks do not adhere well to a polymeric interlayer dielectric, which affects subsequent wafer processing.

SUMMARY OF THE INVENTION

The present invention addresses these and other problems in the prior art by providing a method of fabricating multilevel interconnects for integrated circuit devices, preferably for copper/dual damascene interconnect structures in integrated circuit devices. In one embodiment, a method according to the present invention includes a step of forming a methylated oxide-type hardmask on an interlayer dielectric, wherein the interlayer dielectric includes a polymeric dielectric material. The hardmasks preferred for the invention are those having dielectric constants of less than 3 and more preferably 2.7 or less. Methods according to the present invention can produce integrated circuit devices having lower effective dielectric constants, which enhances device performance and speed.

In the present invention, both the hardmask and the interlayer dielectric can be spincoated. Alternatively, the hardmask can be prepared by CVD techniques.

BRIEF DESCRIPTION OF THE DRAWINGS

The present invention will be better understood by reference to the figures of the drawings, in which like reference numerals represent like elements and in which FIGS. 1 and 2 schematically illustrate cross sections of an interconnect stack formed according to the present invention.

DESCRIPTION OF PREFERRED EMBODIMENTS

Figure 1A:
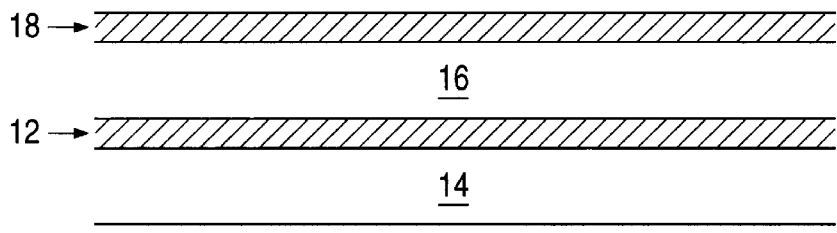

The present invention relates to methods of interconnect integration in semiconductor fabrication techniques by eliminating need for removal of the wafer after formation of a polymeric interlayer dielectric to equipment for forming conventional oxide hardmasks on interlayer dielectrics. The present invention increases device speed by reducing the effective dielectric constant in the stack, and the structures created thereby. Instead of a conventional oxide hardmask, the present invention utilizes methylated oxide-type materials as hardmasks for the interlayer dielectric. As a result, methods according to the present invention benefit from increased compatibility and improved adhesion between the hardmask and interlayer polymeric dielectric and ease of subsequent wafer processing, especially chemical mechanical polishing steps. Methylated oxide-type dielectrics contemplated for hardmasks also have similar etching characteristics to conventional oxide hardmasks so that known processing regimes used successfully for $SiO_2$ and Cu metallization can be utilized.

An interlayer dielectric in accordance with the present invention is suitably a polymeric semiconductor dielectric resin, such as Dow Chemical's SiLK™ material. Advantageously, this material is reported to have a dielectric constant of 2.65, compatible with aluminum/tungsten interconnects and stable to 490° C., and may be processed by conventional spin coating techniques and equipment. The inventors have found that this material is also compatible with copper metallization in dual damascene interconnect structures as well.

Methylated oxide-type dielectrics useful in the present invention are materials exhibiting relatively low dielectric constant (k) of less than 3 and preferably less than about 2.7. These methylated oxide-type dielectrics have k much lower than conventional hardmask materials such as silicon dioxide (k=4) and silicon nitride (k=8), but similar etch and chemical contrast characteristics. Therefore, conventional hardmask thicknesses, etching techniques and chemistries can be used. Exemplary methylated oxide-type dielectrics suitable for the hardmasks prepared in accordance with the present invention include Allied Signal's HOSP™ proprietary materials.

The inventors also have found that significant advantage can be achieved by forming a hardmask from a methylated oxide-type dielectric such as Allied Signal's HOSP™ material by spin coating techniques, since the hardmask may be formed the same equipment immediately following spin-coating of the interlayer dielectric from a polymeric dielectric resin, as described above. In addition, it is contemplated that as many as four layers can be spin coated over the layer adjacent to the wafer without sacrificing performance or processing ease.

The present invention also contemplates formation of methylated oxide-type dielectric by conventional CVD techniques, as an alternative to a spin coated dielectric material. The advantage of spincoated materials compared to CVD deposited materials is reduced cycle time for fabrication since all dielectric layers of the stack can be deposited in the same spin track operation on the same tool. In contrast, the CVD deposited materials require additional process steps and additional tools.

Together, the methylated oxide-type hardmask and the polymeric dielectric material for the interlayer dielectric can significantly reduce the effective dielectric constant, and therefore the capacitance between metal lines, improving device speed, depending on device architecture.

FIGS. 1 and 2 illustrate exemplary interconnect stacks prepared according to the present invention.

Figure 1B:
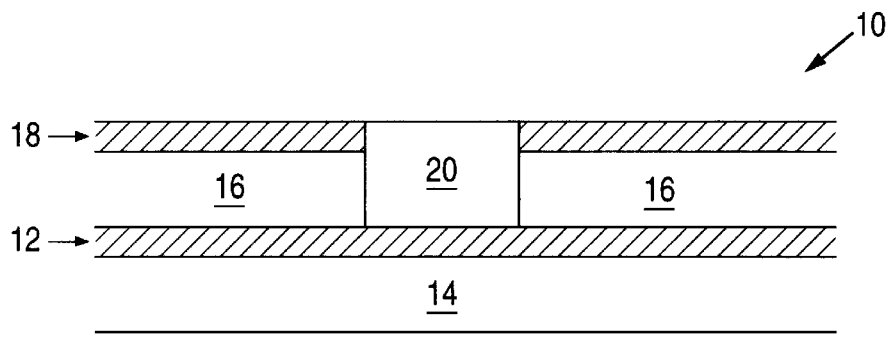

As shown in FIGS. 1a and 1b, a single damascene structure 10 may be fabricated. A silicon nitride diffusion barrier 12 is deposited on a bare silicon substrate 14. A polymeric interlayer dielectric 16 is spun on diffusion barrier 12, followed by a methylated hardmask 18. Dielectric layer 16 is etched and then electroplated with copper to produce the single damascene structure 10 with a copper line 20.

Figure 2A:
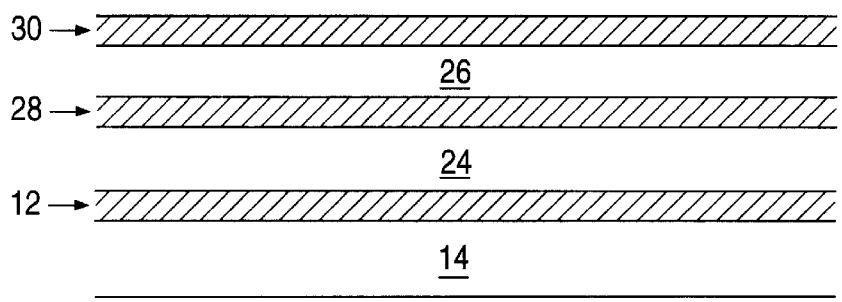
Figure 2B:
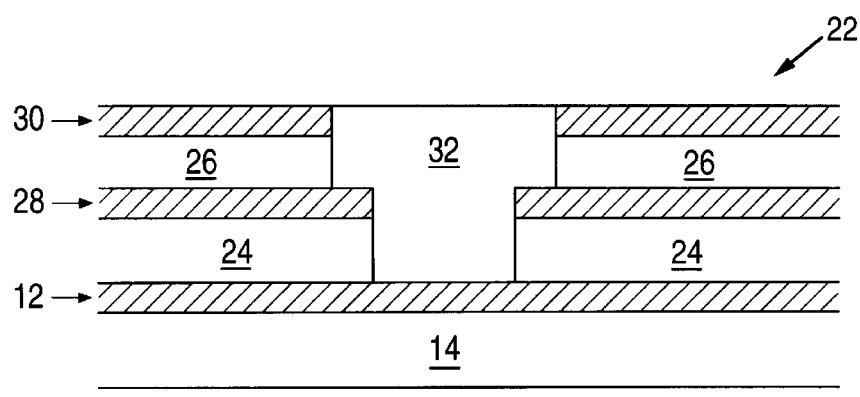

Likewise, as shown in FIGS. 2a and 2b, dual damascene structure 22 can be formed by spinning four alternating layers of polymeric interlayer dielectric 24, 26 and hardmask 28, 30 followed by etch and copper electroplating to form copper line 32.

Table 1 lists typical dimensions of the layers in a stack such as illustrated in FIGS. 1 and 2. As can be appreciated, the thickness of the methylated oxide-type hardmask is consistent with conventional oxide (e.g., USG) hardmask materials. Thickness of the hardmask will depend on the thickness of the underlying dielectric layer and device architecture.

TABLE 1

| layer | interlayer dielectric[1] | hardmask[2] | diffusion barrier[3] |
|---|---|---|---|
| thickness (KÅ) | 7 | 1 | 1 |

[1] e.g., Dow Chemical SiLK™ or Allied Signal FLARE™
[2] Allied Signal HOSP™ or Applied Materials BLACK DIAMOND™
[3] silicon nitride While the present invention is disclosed by reference to the preferred embodiments and examples detailed above, it is to be understood that these examples are intended in an illustrative, rather than limiting sense. It is contemplated that many modifications within the scope and spirit of the invention will readily occur to those skilled in the art and the appended claims are intended to cover such variations.

We claim:

1. A method of fabricating multilevel interconnects for an integrated circuit device, the method comprising the steps of:

forming a first dielectric, layer over the integrated circuit device, the first dielectric layer having a dielectric constant less than three; and forming a first methylated oxide hardmask on the first dielectric layer, the first methylated oxide hardmask defining an exposed surface of the first dielectric layer.

2. The method of claim 1 wherein the first methylated oxide hardmask has a dielectric constant less than three.

3. The method of claim 1 wherein the step of forming a first methylated oxide hardmask includes the steps of:

forming a first methylated oxide layer on the first dielectric layer; and patterning the first methylated oxide layer.

4. The method of claim 3 wherein the first dielectric layer and the first methylated oxide layer are spun on.

5. The method of claim 3 wherein the first dielectric layer is spun on with a tool and the first methylated oxide layer is spun on with the tool.

6. The method of claim 1 and further comprising the steps of:

etching the exposed surface of the first dielectric layer to form an opening; and depositing copper in the opening.

7. The method of claim 1 and further comprising the step of forming a diffusion barrier layer over the integrated circuit device, the first dielectric layer being formed on the diffusion barrier layer.

8. The method of claim 4 and further comprising the step of forming a diffusion barrier layer over the integrated circuit device, the first dielectric layer being formed on the diffusion barrier layer.

9. The method of claim 5 and further comprising the step of forming a diffusion barrier layer over the integrated circuit device, the first dielectric layer being formed on the diffusion barrier layer.

10. The method of claim 1 and further comprising the steps of:

forming a second dielectric layer on the first methylated oxide hardmask, the second dielectric layer having a dielectric constant less than three; and forming a second methylated oxide hardmask on the second dielectric layer, the second methylated oxide hardmask defining an exposed surface of the second dielectric layer.

11. The method of claim 10 wherein the second methylated oxide hardmask has a dielectric constant less than three.

12. The method of claim 10 wherein the step of forming a second methylated oxide hardmask includes the steps of:

forming a second methylated oxide layer on the second dielectric layer; and patterning the second methylated oxide layer.

13. The method of claim 12 wherein the second dielectric layer and the second methylated oxide layer are spun on.

14. The method of claim 12 wherein the second dielectric layer is spun on with a tool and the second methylated oxide layer is spun on with the tool.

15. The method of claim 10 and further comprising the step of forming a diffusion barrier layer over the integrated circuit device, the first dielectric layer being formed on the diffusion barrier layer.

16. The method of claim 13 and further comprising the step of forming a diffusion barrier layer over the integrated circuit device, the first dielectric layer being formed on the diffusion barrier layer.

17. The method of claim 14 and further comprising the step of forming a diffusion barrier layer over the integrated circuit device, the first dielectric layer being formed on the diffusion barrier layer.

18. The method of claim 1 and further comprising the steps of:

etching the exposed surface of the second dielectric layer and the exposed surface of the first dielectric layer to form an opening; and depositing copper in the opening.

* * * * *